United States Patent [19]
Tran et al.

[11] Patent Number: 5,853,960
[45] Date of Patent: Dec. 29, 1998

[54] METHOD FOR PRODUCING A MICRO OPTICAL SEMICONDUCTOR LENS

[75] Inventors: Dean Tran, Westminster; Eric R. Anderson, Redondo Beach; Ronald L. Strijek, Vista; Edward A. Rezek, Torrance, all of Calif.

[73] Assignee: TRW Inc., Redondo Beach, Calif.

[21] Appl. No.: 40,636

[22] Filed: Mar. 18, 1998

[51] Int. Cl.$^6$ ......................... H01L 27/14; H01L 31/0304
[52] U.S. Cl. .................................. 430/321; 216/2; 216/26
[58] Field of Search ................................. 430/321; 216/2, 216/26; 219/121.69, 121.73

[56] References Cited

U.S. PATENT DOCUMENTS

| | | | |
|---|---|---|---|
| 5,018,164 | 5/1991 | Brewer et al. | 372/109 |
| 5,316,640 | 5/1994 | Wakabayshi et al. | 204/192.34 |
| 5,346,583 | 9/1994 | Basavanhally | 430/321 |

FOREIGN PATENT DOCUMENTS

| | | | |
|---|---|---|---|
| 7-030082 | 1/1995 | Japan . | |

OTHER PUBLICATIONS

Photoelectrochemical etching of integral lenses on lnGaAs/InP light–emitting diodes, Appl. Phys. Lett. 43 pp. 624–644, Oct. 1983.

Small–Junction–Area *GaInAs/InP pin* Photodiode with Monolithic Microlens, Electronics Letters vol.24 No.2 pp. 109–110, Jan. 1988.

Microsystems and Waferprocesses for Volumeproduction of Highly Reliable Fiber Optic Components for Telecom–and Datacom–Application, IEEE Electronic Components and Technology Conference pp. 7–15, 1997.

Micromirror arrays using $KOH:H_2O$ micromachining of silicon for lens templates, geodesic lenses, and other applications, Optical Engineering vol. 33 No. 11 pp. 3578–3587, Nov. 1994.

Preshaping photoresist for refractive microlens fabrication, Optical Engineering vol. 33 No. 11 pp. 3552–3555, Nov. 1994.

Technique for monolithic fabrication of silicon microlenses with selectable rim angles, Optical Engineering vol. 33 No. 11 pp. 1095–1098, Apr. 1997.

Dry etching for coherent refractive microlens arrays, Optical Engineering vol. 33 No. 11 pp. 3547–3551, Nov. 1994.

Mass–transport fabrication of large–numerical–aperature microoptics, SPIE vol. 2383 pp. 310–317, Feb. 1995.

*Primary Examiner*—John A. McPherson
*Attorney, Agent, or Firm*—Michael S. Yatsko

[57] ABSTRACT

The invention relates to a method for fabricating III–V semiconductor micro-optical lenses for hybrid integration with micro-optical devices, where a micro-optical lens is formed from a semiconductor wafer by selectively etching a surface of the semiconductor wafer and a lens arm is formed from the semiconductor wafer on a surface opposite the surface by selectively etching the surface of the semiconductor wafer. The lens and lens arm are then cleaved from the substrate wafer and directly mounted to a micro-optical device. As a result of using III–V semiconductor material to form micro-optical lenses for hybrid integration to micro-optical devices of the same semiconductor material, thermal expansion stability is increased and efficient transfer of light between micro-optical lenses and micro-optical devices is achieved.

53 Claims, 3 Drawing Sheets

METHOD FOR PRODUCING A MICRO OPTICAL SEMICONDUCTOR LENS

BACKGROUND OF THE INVENTION

1. Field of the Invention

The present invention relates to micro-optical lens fabrication and, more specifically, to a method for producing III–V semiconductor micro-optical lenses for hybrid integration to micro-optical devices where the construction of the micro-optical lens is accomplished by using the etching characteristics of III–V semiconductors and a micro-lens arm is constructed from the same III–V semiconductor material for direct mounting of the micro-optical lens to the micro-optical devices.

2. Description of the Prior Art

Compact and simple lens systems for micro-optical devices are essential in optical communications systems. Present optical systems use a variety of techniques for micro-optical lens fabrication and a variety of techniques to obtain efficient coupling between micro-optical lenses and micro-optical devices.

The publication, "Photoelectrochemical etching of integral lenses on InGaAsP/InP light-emitting diodes", Appl. Phys. Lett. 43 pp. 642–644, October 1983 discloses integrated lenses formed in a semiconductor material containing light-emitting diodes where the integrated lenses are fabricated by a photoelectrochemical etching technique on InP semiconductor material.

The "Small-Junction-Area GaInAs/InP pin Photodiode with Monolithic Microlens", Electronics Letters Vol. 24 No. 2 pp. 109–110, January 1988 publication discloses another integrated lens fabrication technique where a micro-lens is fabricated on a back-illuminated GaInAs/InP pin photodiode (InP based semiconductor material). The micro-lens is formed by an Ar-ion beam etching technique.

Micro-lens fabrication on silicon (Si) wafers is used regularly in photonics packaging to focus a light beam on a target. The publications "Microsystems and Waferprocesses for Volumeproduction of Highly Reliable Fiber Optic Components for Telecom- and Datacom-Application", IEEE Electronic Components and Technology Conference pp. 7–15, 1997; "Micromirror arrays using KOH:$H_2O$ micromachining of silicon for lens templates, geodesic lenses, and other applications", Optical Engineering Vol. 33 No. 11 pp. 3578–3587, November 1994; and "Dry etching for coherent refractive microlens arrays", Optical Engineering Vol. 33 No. 11 pp. 3547–3551, November 1994 all disclose methods for micro-lens fabrication on silicon wafers. The publication, "Microsystems and Waferprocesses for Volumeproduction of Highly Reliable Fiber Optic Components for Telecom- and Datacom-Application", discloses the fabrication of an array of micro-lenses on a silicon (Si) wafer by a dry-etching process. The "Micromirror arrays using KOH:$H_2O$ micromachining of silicon for lens templates, geodesic lenses, and other applications" publication forms wet-chemical etched micro-mirror depressions which can be used as templates for micro-lenses and as substrates for geodesic waveguide lenses and arrays. The "Dry etching for coherent refractive microlens arrays" publication discloses a technique for fabricating coherent arrays of refractive micro-optics on the surface of silicon using a combination of lithographic and reactive-ion etching (RIE) techniques.

In some known applications, micro-lenses are formed on semiconductor substrates by a process where the micro-lens is formed from photoresist material. One such application is disclosed in the publication "Preshaping photoresist for refractive microlens fabrication", Optical Engineering Vol. 33 No. 11 pp. 3552–3555, November 1994 where refractive microlenses are fabricated by the preshaped photoresist refractive optics through a melting process on a silicon dioxide ($SiO_2$) substrate. Another such application is disclosed in the publication "Technique for monolithic fabrication of silicon microlenses with selectable rim angles", Optical Engineering Vol. 33 No. 11 pp. 1095–1098 April 1997, where photoresist lenses are formed on silicon (Si) substrates.

Mass-transport processing on GaAs, GaP, and InP semiconductor wafers to produce large-aperture microlenses is also know in the art. The publication, "Mass-transport fabrication of large-numerical-aperture microoptics", SPIE Vol. 2383 pp. 310–317, February 1995 discloses a mass-transport processing technique for microlens fabrication. This technique utilizes surface-energy-induced mass transport to smooth etched structures which once smoothed form a lens.

While each of the micro-lens fabrication techniques in the publications mentioned above have advantages, there are some disadvantages. For example, the techniques disclosed in the publications "Photoelectrochemical etching of integral lenses on InGaAsP/InP light-emitting diodes", Appl. Phys. Lett. 43 pp. 642–644, October 1983 and "Small-Junction-Area GaInAs/InP pin Photodiode with monolithic microlens", Electronics Letters Vol. 24 No. 2 pp. 109–110, January 1988 both exploit the advantages gained by forming monolithically integrated lenses in semiconductor materials. However, the technique disclosed in the "Photoelectrochemical etching of integral lenses on InGaAsP/InP light-emitting diodes" publication uses a complicated optical system to etch the microlens and this technique is difficult to use for high-volume production since one small wafer must be processed at a time. The technique disclosed in the "Small-Junction-Area GaInAs/InP pin Photodiode with Monolithic Microlens" publication also has disadvantages because the photoresist (PR) mask used in this technique may deteriorate in the vacuum chamber with a high dose of Ar-ion bombardment during the etching process. Additionally, lenses formed by this method typically do not exhibit smooth surfaces when examined at the sub-micron scale with a scanning electron microscope (SEM).

Regarding microlens fabrication on silicon wafers, silicon usually produces terraces and pits that prevent smoothness in the lens. Also, when using silicon to make a microlens, photoresist (PR) cannot be used as an etch mask since potassium hydroxide (KOH) based etchants etch away all the photoresist before attacking the silicon. Therefore, special masks such as silicone dioxide ($SiO_2$), silicon nitride (SiN), or metal are required. The publication "Dry etching for coherent refractive microlens arrays", Optical Engineering Vol. 33 No. 11 pp. 3547–3551, November 1994, discloses a technique which was adapted to meet the specific demands of some optical structures. However, the fabrication of this type of lens is complex (multiple photoresist, silox, planarizing, and etching steps). Additionally, the use of standard photoresist masks may result in micro-masking and grass formation during reactive ion etching (RIE), thus causing low yield and rugged lens surfaces. Finally, this technique is not suitable for the production of large diameter lens due to the difficulty of deep etching recesses.

Regarding microlens fabrication from photoresist materials, lenses fabricated by this technique typically cannot withstand varied temperature cycles and long term reliability is an issue.

The fabrication of lenses by mass-transport processing techniques is complicated. This mass-transport technique requires a dry etch to form lens patterns on the surface of GaAs, GaP, and InP semiconductor substrates. These substrates are then baked at high temperatures near 1000° C. to melt down the patterns. The baking treatment disclosed in the "Mass-transport fabrication of large-numerical-aperture microoptics", SPIE Vol. 2383 pp. 310–317, February 1995 publication would, as a result of the high temperatures, degenerate a lens surface due to the low vapor pressure of phosphorous (P) and arsine (As). Although phosphorous and arsine overpressure may be used to minimize the outgassing of phosphorous and arsine, indium (In) or gallium (Ga) droplets on the lens surface are unavoidable. These droplets cause surface defects to the lens. The defect increases the light scattering and, therefore, reduces the intensity of a light beam as it passes through the lens.

Present optical systems use a variety of coupling techniques for micro-optical lenses and micro-optical devices. However, these schemes typically use many components and require a complicated assembly process. In addition, these components are made of different materials and have different thermal expansion coefficients. These differences can cause optical misalignment during temperature changes, particularly for military and space applications where wide temperature variations are common. Additionally, when using discrete bulk optical components, the complexity of the assembly process is increased; there are more individual components to align. This complexity can increase assembly cost and reduce reliability.

Based on techniques known in the art for III–V semiconductor lens fabrication and coupling schemes, a lens that can be made of the same material and is more easily integrated with a micro-optical device is highly desirable.

SUMMARY OF THE INVENTION

Briefly, the present invention relates to methods for producing a III–V semiconductor lenses for direct mounting (hybrid integration) to micro-optical devices (diode lasers, detectors, waveguides). The semiconductor lens can either be used for focusing the optical output of emitters or for collecting the optical input to waveguides or detectors. The construction of the lens is accomplished by using the etching characteristics of III–V semiconductors. A diffractive or refractive lens is formed by chemically etching one side of a semiconductor substrate. After the lens is formed, a dry etch is used to form an arm for supporting the lens to the micro-optical device. The ability to form a high quality micro-optical semiconductor lens for direct mounting to a semiconductor device has several advantages. First, because the lens can be made of the same semiconductor material as the device, there is better thermal expansion match between the lens and the micro-optical device. Having the best thermal expansion match is importatant for stability where differences in thermal expansion coefficients can cause optical misalignments during temperature changes. Further, efficient coupling can be accomplished between the lens and the device without the use of complex coupling and alignment schemes which require many components and complicated assembly processes. Finally, very precise semiconductor lens fabrication is possible by using standard photolithographic processes and wafer level fabrication can result in high volume manufacturing and high reproducibility.

It is an aspect of the present invention to provide a method for producing a III–V semiconductor micro-optical lens for hybrid integration to a micro-optical device. The method comprises the steps of coating a layer of photoresist material over an entire surface of a side of a substrate wafer; baking the substrate wafer; providing a mask where a pattern of the mask determines the quantity and shape of a lens formed on the substrate wafer; selectively aligning the mask to the substrate wafer on the side of the substrate wafer coated with the layer of photoresist material; exposing the side of the substrate wafer coated with the layer of photoresist material to a light source to form a photoresist mask; developing the side of the substrate wafer containing the photoresist mask; selectively etching the side of the substrate wafer coated with the layer of photoresist material in the areas surrounding the photoresist mask; removing the photoresist mask and cleaning the surface of the substrate wafer; selectively etching the entire surface of the side of the substrate wafer to form the lens; coating the entire surface of the side of the substrate wafer with an anitireflectivity coating; and finally, fabricating a lens arm from a surface of a side of the substrate wafer opposite the side of the substrate wafer where the lens has been formed.

It is an aspect of the present invention to provide a second method for producing a III–V semiconductor micro-optical lens for hybrid integration to a micro-optical device. The method comprises the steps of selectively boring a surface of a side of a substrate wafer to form a lens; cleaning the surface of the side of the substrate wafer; then, selectively etching the entire surface of the side of the substrate wafer where the lens is formed to polish the lens; coating the entire surface of the side of the substrate wafer with an antireflectivity coating; and finally, fabricating a lens arm from a surface of a side of the substrate wafer opposite the side of the substrate wafer where the lens has been formed.

Another aspect of the present invention is to provide a method for producing a III–V semiconductor micro-optical lens arm for hybrid integration to a micro-optical device. The method comprises the steps of coating a layer of photoresist material over an entire surface of a side of a substrate wafer opposite a side of the substrate wafer where a lens has been formed; baking the substrate wafer to prepare the photoresist material; providing a mask where a pattern of the mask determines the quantity and size of a lens arm formed on the substrate wafer; selectively aligning the mask to the substrate wafer on the side of the substrate wafer coated with the layer of photoresist material; exposing the side of the substrate wafer coated with the layer of photoresist material to a light source to form a photoresist mask; developing the side of the substrate wafer coated with the photoresist material; etching the side of the side of the substrate wafer coated with the layer of photoresist material in the areas surrounding the photoresist mask to form a lens arm and a trough area surrounding the lens arm; removing the photoresist mask and cleaning the surface of the substrate wafer; metallizing the lens arm; cleaving the lens arm and lens to remove the lens arm and lens from the substrate wafer; and finally, mounting the lens to the micro-optical device.

BRIEF DESCRIPTION OF THE DRAWINGS

Reference is now made to the following specification and attached drawings, wherein:

FIG. 1b is a front view illustration of the mask of FIG. 1a;

FIG. 1c is a side view illustration of the substrate wafer and a photoresist mask formed on the surface of the substrate following the exposure of the substrate wafer to the ultra-violet light source in accordance with the present invention;

FIG. 1d is a front view illustration of the photoresist mask of FIG. 1c;

FIG. 1e is a side view illustration of the selectively etched surface of the substrate to begin the formation of the array of spherical lenses in accordance with the present invention;

FIG. 1f is a side view illustration of the selectively etched surface of FIG. 1e where the photoresist mask is removed in accordance with the present invention;

FIG. 1g is a side view illustation of the surface of the substrate wafer of FIG. 1f where the surface of the substrate wafer is etched further to form an array of lenses in accordance with the present invention;

FIG. 1i is a side view illustration of the array of lenses coated with a layer of antireflectivity coating in accordance with the present invention;

FIG. 2a is a front view illustration of an alternative mask used to form cylindrical lenses;

FIG. 2b is a front view illustration of an alternative mask used to form semi-cylindrical and gausian-cylindrical lenses;

FIG. 2c is a front view illustration of an alternative mask used to form semispherical and aspherical lenses;

FIG. 2d is a cross view illustration of a semi-spherical or semi-cylindrical lens;

FIG. 2e is a cross view illustration of an aspherical or gausian-cylindrical lens;

FIG. 3 is a side view illustration of the selectively etched surface of the substrate to begin the formation of an array of cylindrical lenses;

FIG. 4b is a front view illustration of the mask of FIG. 4a;

DETAILED DESCRIPTION OF THE INVENTION

As previously mentioned, the present invention relates to an improvement in the coupling of compact and simple micro-optical lens systems with micro-optical devices. Present optical systems use a variety of coupling schemes which can be very complex and unreliable. In order to produce less complex more efficient coupling between micro-optical lenses and micro-optical devices a lens can be formed from the same semiconductor material as a device and directly mounted to the micro-optical device. Direct mounting of the micro-optical lens to the micro-optical device allows the lens to be in closer proximity to the micro-optical device thus allowing for a less divergent beam of light to be transferred between the device and the lens. Additionally, because the lens material is the same material as the device similar thermal expansion properties make the optical system formed by the lens and device more reliable.

It should be understood by those of ordinary skill in the art that the principles of the present invention are applicable to many types of micro-optical lenses and micro-optical devices, such as diffractive lenses, refractive lenses, diode laser devices, and waveguide devices. The principles of the present invention are also applicable to many types of III–V semiconductors, such as indium phosphide (InP), gallium arsenide (GaAs), indium arsenide (InAs), and gallium phosphide (GaP). For illustration, the invention is described and illustrated further in FIGS. 1a through 1i with a substrate wafer 24, and lens 42; FIGS. 4a through 4k with substrate wafer 24, lens 42, and lens arm 58; and FIG. 5 with lens 42, lens arm 58, and mirco-optical device 82.

Figure 1A:
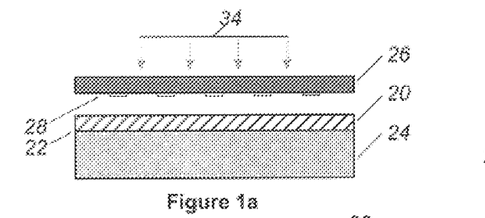
FIG. 1a is a side view illustration of a substrate wafer which includes a layer of photoresist material on a surface of the substrate wafer where the photoresist layer is exposed by an ultra-violet light source through a mask to form a lens in accordance with the present invention.

More specifically, and with reference to the drawings, the first steps of the micro-optical lens fabrication for hybrid integration, as illustrated in FIGS. 1a through 1i, relate to the formation of a micro-optical lens from a semiconductor material by photolithography processes. The first step of the lens fabrication process, as illustrated in FIG. 1a, is coating a layer of photoresist material 20 over an entire surface 22 of an indium phophide (InP) substrate wafer 24. The preferred photoresist material 20 is 2-ethoxpyethylacetate (60%) and n-butyl acetate (5%) in xylen and hexamethyldisilozane (HDMS), and is preferred for its suitability for use in the dry etching of deep profiles on indium phosphide (InP) and related semiconductor materials or other hard to etch semiconductor wafers. The indium phosphide substrate wafer 24 is chosen for its etching characteristics and its ability to form a high index lens with low aberrations. It is important to note that other materials can be used for the substrate wafer 24 and the photoresist coating 20. For example, the substrate wafer 24 may be any III–V semiconductor material and may include indium phosphide (InP), gallium arsenide (GaAs), indium arsenide (InAs), and gallium phosphide (GaP). The photoresist coating material 20 may include 2-ethoxyethylacetate+n-butyl acetate in xylen solvent, 2-ethoxyethylacetate+n-butyl acetate in xylen and silicon dioxide ($SiO_2$) precoated, 2-ethoxyethylacetate+n-butyl acetate in xylen and silicon nitride ($Si_3N_4$) precoated, silicon dioxide ($SiO_2$) and complex silicon nitride ($Si_xN_y$), or aluminum oxide ($Al_2O_3$) precoated.

After coating the layer of photoresist material 20 over the surface 22 of the substrate wafer 24, the substrate wafer 24 is soft baked at a temperature of approximately 100° C. and for a period of approximately 45 minutes to remove any solvent from the photoresist material 20.

Figures 1B, 1C, 1D, 1E, 1F, 1G, 1I, 2, 2B, 2D, 2E, 3:
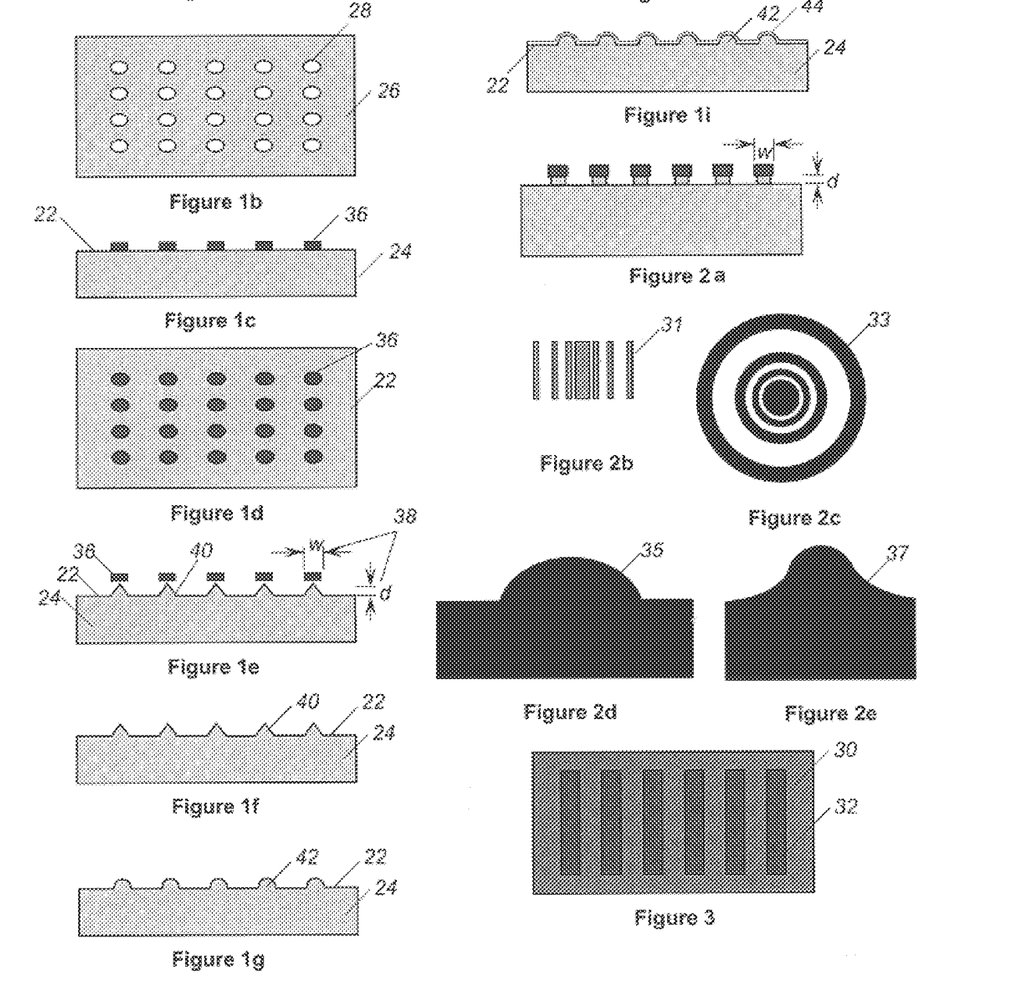

Next, as illustrated in FIGS. 1a and 1b, a mask 26 is used to transfer a lens pattern 28 from the mask 26 to the substrate wafer 24. FIG. 1b illustrates a front view of the mask 26 with a spherical lens pattern 28. Lens patterns are chosen based on the quanity and type of lens required for a particular optical application. For the purposes of the preferred embodiment an array of spherical lenses is chosen and is transferred using the dot mask 26. The quantity of lenses formed on a semiconductor substrate wafer can range from 1 to many and the lens shapes may be semi-spherical, aspherical, semi-cylindrical, or gausian-cylindrical as dictated by the mask pattern. In addition to dot mask patterns, strip and hybridized etching mask patterns can be used. For example, FIG. 2a illustrates a front view of a strip mask 30 with a semi-cylindrical lens pattern 32 for an arrray of semi-cylindrical lenses. Hybridization etching mask patterns can be used to form semi-cylindrical, gausian-cylindrical, semi-spherical, and aspherical lenses. Semi-cylindrical and gausian-cylindrical lenses are formed using hybridized etching by varying the dark and light field spacing of masks similar to the mask 31 shown in FIG. 2b. As illustrated in FIG. 2c, varying the light and dark ring spaces of a mask similar to the mask 33 will change the shape of a lens from semi-spherical to aspherical. Various lens shapes are illustrated in FIGS. 2d and 2e where FIG. 2d illustrates a cross view of a semi-spherical or semi-cylindrical lens 35 and FIG. 2e illustrates a cross view of an aspherical or gausian-cylindrical lens 37.

As shown in FIG. 1a, the mask 26 is aligned to the substrate wafer 24 and the layer of photoresist material 20 is exposed to an ultra violet UV light source 34 through the mask 26 to tranfer the lens pattern 28 to the substrate wafer 24. Next, as illustrated in FIG. 1c, the layer of photoresist material 20 of FIG. 1a is developed to form a photoresist mask 36 on the surface 22 of the substrate wafer 24. The development of photoresist material is a standard step in photolithography processing. A front view of the developed photoresist mask 36 is illustrated in FIG. 1d.

Following the previously mentioned photolithography steps, the substrate wafer 24 is selectively etched in the areas surrounding the photoresist mask 36, as illustrated in FIG. 1e. For substrate wafers precoated with oxide or nitride photoresist, the oxide or nitride must be removed before the selective etching is performed. The selective etching step is done to begin the formation of a lens and can be accomplished by a wet-chemical etch process as illustrated in FIG. 1e or a dry etch process as illustrated in FIG. 3. For the purposes of the preferred embodiment, the surface 22 of the substrate wafer 24 shown in FIG. 1e is wet-chemically etched in a deionized water:potassium dichromate:acetic acid:hydrobromic acid ($H_2O:K_2Cr_2O_7:H_3CCOOH:HBr$), 450 ml: 66 g: 100 ml: 300 ml solution at a temperature of from 40° C. to 60° C. Depending on the substrate material used, alternative wet-chemical etch solutions can include bromnine:methanol ($Br_2:H_3COH$), bromine:isopropanol ($Br_2:H_5C_2OH$), deionized water:hydrobromic acid:acetic acid ($H_2O:HBr:H_3CCOOH$), deionized water:potassium dichromate:sulfaric acid:hydrochloric acid ($H_2O:K_2Cr_2O_7:H_2SO_4:HCl$), phosphoric acid:hydrochloric acid ($H_3PO_4:HCl$), phosphoric acid:hydrochloric acid: deionized water ($H_3PO_4:HCl:H_2O$), phosphoric acid:hydrochloric acid:hydrogen peroxide ($H_3PO_4:HCl:H_2O_2$), iron chloride:hydrochloric acid ($FeCl_3:HCl$) under illumination, potassium periodide:hydrochloric acid ($KIO_3:HCl$), hydrochloric acid:acetic acid:hydrogen peroxide ($HCl:acetic acid:H_2O$), hydrochloric acid:hydrogen peroxide:deionized water ($HCl:H_2O_2:H_2O$), sulfuric acid:hydrogen peroxide:deionized water ($H_2SO_4:H_2O_2:H_2O$), citric acid:hydrogen peroxide:deionized water (citric acid: $H_2O_2:H_2O$), bromine:methanol ($Br_2:CH_3OH$), nitric acid:hydrofloric acid: deionized water ($HNO_3:HF:H_2O$), or hydrogen peroxide:amonium hydroxide: deionized water ($H_2O_2:NH_4OH:H_2O$).

Dry etching to begin the formation of a lens, as shown in FIG. 3, may be accomplished by one of several dry etch processes which may include electron cyclotron resonance (ECR) etching, inductive couple plasma (ICP) etching, or reactive-ion etching (RIE). Dry etch mixtures may include argon and hydrochloric acid (Ar/HCl), argon hydrogen and chlorine ($Ar/Cl_2/H_2$), argon and hydrobromic acid (Ar/Hbr), argon and bromine ($Ar/Br_2$), argon and chlorine ($Ar/Cl_2$), argon and methane and hydrogen ($Ar/CH_4/H_2$), methyl iodide ($H_3CI$), bromine iodide ($IBr_3$), methane and hydrogen and sulfur flouride ($CH_4/H_2/SF_6$), ethyl iodide ($C_2H_5I$), isoethyl iodide ($C_3H_7I$), hexaflouride carbon and hydrogen ($C_2F_6/H_2$), or dichloro-difluoro carbon and oxygen ($CCl_2F_2/O_2$).

Additionally, as shown in FIG. 1e, the lens shape can be varied from semi-spherical to aspherical or semi-cylindrical to gausian-cylindrical depending on a depth/width ratio 38 attained during the etching process.

Following the etching of the surface 22 of the substrate wafer 24 in the areas surrounding the photoresist mask 36, by either the wet-chemical or dry etch process previously mentioned, the photoresist mask 36 is removed from the surface 22 of the substrate wafer 24, as illustrated in FIG. 1f. The photoresist mask 36 is removed and the surface 22 of the substrate wafer 24 is cleaned by first removing the photoresist mask 36 using acetone. Following the removal of the photoresist mask 36, the acetone is removed from the surface 22 of the substrate wafer 24 with isopropanol and the isopropanol is removed from the surface 22 of the substrate wafer 24 using deionized water. The photoresist can also be removed using photoresist stripper, potassium hydroxide, or other equivalent alkaline chemicals followed by a deionized water rinse. Finally, oxides are removed from the surface 22 of the substrate wafer 24 using potassium hydroxide (KOH) and etch residue is removed from the surface 22 of the substrate wafer 24 using a solution of sulfuric acid:hydrogen perodixe:deionized water ($H_2SO_4:H_2O_2:H_2O$).

Figure 1H:
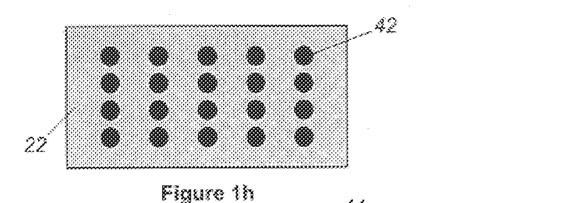
FIG. 1h is a front view illustration of the array of lenses of FIG. 1g.

Next, an array of lenses are formed by etching the entire surface 22 of the substrate wafer 24 (FIG. 1f), where etched peaks 40 on the surface 22 of the substrate wafer 24 have been formed. The same wet-chemical etching solution described in FIG. 1e is used here to form an array of lenses by smoothing the surfaces of the etched peaks 40. Etching the entire surface 22 of the substrate wafer 24 to form a lens requires that the etching be done at a lower temperature, preferably 30° C. to 40° C. The result of this low temperature etch, as illustrated in FIG. 1g, is an array of lenses 42 formed on the surface 22 of the substrate wafer 24. FIG. 1h illustrates a front view of the array of lenses 42 formed on the surface 22 of the substrate wafer 24.

The lenses 42 are then coated with antireflectivity coating 44 using an electron beam (e-beam) evaporation process, as illustrated in FIG. 1i. Although the illustrated embodiment uses an e-beam evaporation process to apply the antireflectivity coating, alternative processes like sputtering or chemical vapor deposition (CVD) can also be used. For the purposes of the illustrated embodiment, a crystal mixture of antireflectivity (AR) coating which contains magnesium flouride (MgF), aluminum oxide ($Al_2O_3$), hafnium flouride (HfF), silicon dioxide ($SiO_2$), and silicon nitride ($Si_3N_4$) is deposited over the entire surface 22 of the substrate wafer 24 containing the array of lenses 42.

Figure 6:
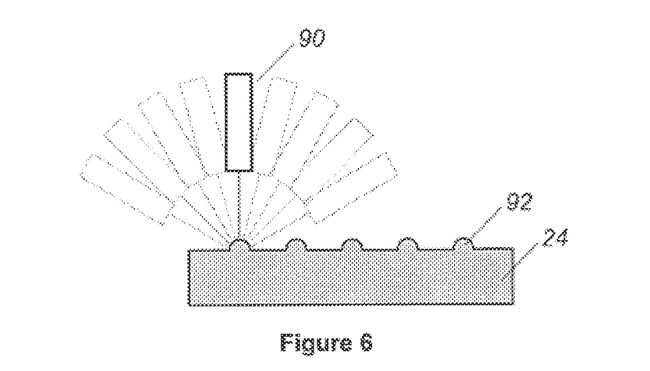
FIG. 6 is an illustration of a boring process to form lenses in accordance with the present invention.

Alternatively, a lens fabrication process which alleviates the photolithography steps in the previously illustrated preferred embodiment uses a laser beam to bore the semiconductor materials to form a lens on a surface of a substrate wafer, as shown in FIG. 6. The boring step is followed by cleaning the surface of the substrate wafer containing the lens by using potassium hydroxide and removing etch residue from the surface of the substrate wafer in a sulfuric acid:hydrogen peroxide:deionized water ($H_2SO_4$:$H_2O_2$:$H_2O$) solution. Following the cleaning step, the surface of the substrate wafer is etched to polish the surface of the lens. Etching to polish the surface of the lens is accomplished by using one of the wet-chemical etch solutions mentioned in the illustrated embodiment. Finally, antireflectivity coating is deposited on the lens using the same process mentioned in the illustrated embodiment.

As previously mentioned, the capability to direct mount a micro-optical lens to a micro-optical device where both are of the same semiconductor material is significant for efficient transfer of light and thermal excursion stability. To accomplish this direct mounting, lens arms are formed on a surface of a substrate wafer opposite the surface where lenses have been formed.

Figure 4A:
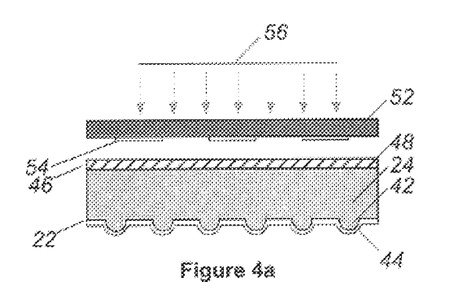
FIG. 4a is a side view illustration of the substrate wafer which includes a layer of photoresist material on a surface of the substrate wafer opposite the surface containing the array of lenses, where the layer of photoresist material is exposed by an ultra-violet light source through a mask to form a lens arm in accordance with the present invention.

The first steps in the fabrication of the lens arms are photolithography steps, as shown in FIG. 4a. The first step includes coating a layer of photoresist material 46 over the entire surface 48 of the substrate wafer 24 opposite the surface 22 of the substrate wafer 24 where the array of lenses 42 have previously been formed. The preferred photoresist material 46 is 2-ethoxyethylacetate+n-butyl acetate in xylen and hexamethyldisilozane (HDMS) and is chosen because it is able to withstand the extreme physical conditions of the dry etching process. Next, the substrate wafer 24 is soft baked at a temperature of approximately 100° C. for a period of approximately 45 minutes to remove solvents from the photoresist material 46.

Figure 4B:
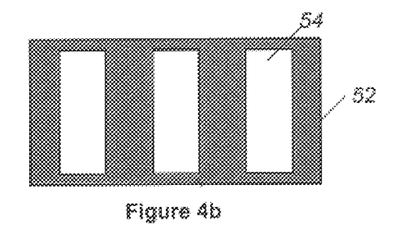

As further illustrated in FIG. 4a, a mask 52 is used to transfer a micro-optical lens arm pattern 54 to the substrate wafer 24. A front view of the lens arm pattern 54 of the mask 52, is shown in FIG. 4b and is chosen for the quantity and dimension of the lens arms required to match the array of lenses 42 formed on the opposite surface 22 of the substrate wafer 24 shown in FIG. 4a. Because the preferred embodiment illustrates the formation of an array of spherical lens 42, the mask 52 is chosen so that the pattern 54 matches the arrray of spherical lenses 42, formed on the opposite surface 22 of the substrate wafer 24. It is important to note, however, that the quantity of the lens arms formed on the substrate wafer 24 can range from 1 to many and the lens arm dimensions may vary depending on the required optical application.

Next, as shown in FIG. 4a, the mask 52 is selectively aligned to the substrate wafer 24 using an infra-red camera. The infra-red camera can be used to look through the substrate wafer 24 to align the lens arm pattern 54 to the array of lenses 42 formed on the opposite surface 22 of the substrate wafer 24. Using standard photolithography steps, the layer of photoresist material 46 is exposed with an ultra-violet light source 56 through the mask 52.

Figure 4C:
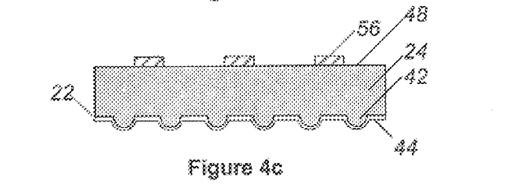
FIG. 4c is a side view illustration of the substrate wafer and a photoresist mask formed on the surface of the substrate following the exposure of the substrate wafer to the ultra-violet light source in accordance with the present invention.
Figure 4D:
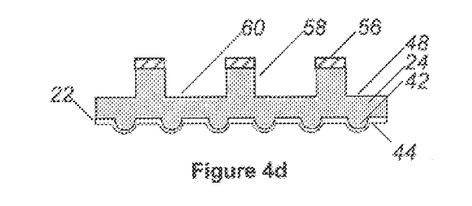
FIG. 4d is a side view illustration of the selectively etched surface of the substrate wafer where the array of lens arms are formed in accordance with the present invention.

The layer of photoresist material 46 is developed creating a photoresist mask 56 on the surface 48 of the substrate wafer 24, as shown in FIG. 4c. The surface 48 of the substrate wafer 24 containing the photoresist mask 56 is dry etched in the areas surrounding the photoresist mask 56 to form the lens arms 58 and surrounding trough areas 60, as shown in FIG. 4d. The lens arms 58 are formed by dry etching with a mixture of argon and hydrochloride (Ar/HCl) using an electron resonance (ECR) etching. However, the dry etch process may alternatively use inductive couple plasma (ICP) etching, reactive-ion etching (RIE), or ion milling. The dry etch mixture may alternatively include argon and chlorine (Ar/$Cl_2H_2$), argon and hydrobromic acid (Ar/Hbr), argon and bromine (Ar/$Br_2$), argon and chlorine (Ar/$Ci_2$), argon and methane and hydrogen (Ar/$CH_4$/$H_2$), methyl iodide ($H_3$CI), bromine iodide ($IBr_3$), methane and hydrogen and sulfur flouride ($CH_4$/$H_2$/$SF_6$), ethyl iodide ($C_2H_5$I), isoethyl iodide ($C_3H_7$I), hexaflouride carbon and hydrogen($C_2F_6$/$H_2$), or dichloro-difluoro carbon and oxygen ($CCl_2F_2$/$O_2$). It is important to note that dry etching at this step is preferred over wet-chemical etching in order to protect the lenses 42 formed on the opposite surface 22 of the substrate wafer 24 from attack by a wet-chemical etch solution and to etch the deep profiles required for the lens arm fabrication.

Figure 4E:
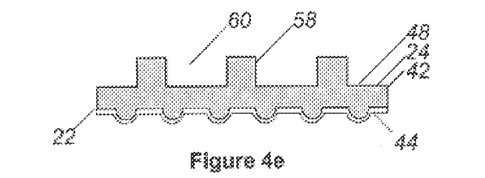
FIG. 4e is a side view illustration of the selectively etched surface of FIG. 4d where the photoresist mask is removed in accordance with the present invention.

Following the formation of the lens arms 58, the photoresist mask 56 is removed from the surface 48 of the substrate wafer 24 and the surface 48 of the substrate wafer 24 is cleaned, as shown in FIG. 4e. The photoresist mask 56 is removed using acetone. Following the removal of the photoresist mask 56, the acetone is removed from the surface 48 of the substrate wafer 24 with isopropanol and the isopropanol is removed from the surface 48 of the substrate wafer 24 using deionized water. The photoresist mask 56 can also be removed with photoresist stripper, postassium hydroxide, or other equivalent alkaline chemicals followed by a deionized water rinse. Finally, oxides are removed from the surface 48 of the substrate wafer 24 using potassium hydroxide (KOH) and the etch solution is removed from the surface 48 of the substrate wafer 24 using a solution of sulfuric acid:hydrogen perodixe:deionized water ($H_2SO_4$:$H_2O_2$:$H_2O$).

Figure 4F:
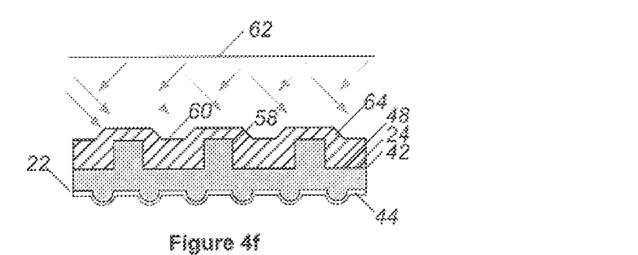
FIG. 4f is a side view illustration of the substrate wafer and a layer of photoresist layer coated over the surface of the substrate where the array of lens arms are formed and the layer of photoresist material is exposed to an ultra-violet light source in accordance with the present invention.

To mount the lens 42 directly to a micro-optical device, the lens arm 58 is metallized. As illustrated in FIG. 4f, the metallization process begins by coating a layer of photoresist material 64 over the entire surface 48 of the substrate wafer 24 where the lens arms 58 have been formed. The layer of photoresist material 64 is coated to a thickness sufficient to allow only approximately one-half of the photoresist layer 64 in the trough areas 60 to be penetrated during a subsequent exposure process. The layer of photoresist material 64, 2-ethyoxyethylacetate+n-butyl acetate in xylen, is coated on the surface 48 of the substrate wafer 24 by a spin-on process at a spin speed of approximately 2000 rpm.

The substrate wafer 24 is then soft baked at a temperature of from approximately 80° C. to 135° C. for a period of approximately 45 minutes to remove solvents from the layer of photoresist material 64. Next, the layer of photoresist material 64 is float exposed at approximately 150 mj/cm$^2$ using an ultraviolet light source 62 of approximately 360 nm. Float exposure involves exposing the photoresist coated substrate wafer 24 to the ultraviolet light source without a mask.

Figure 4G:
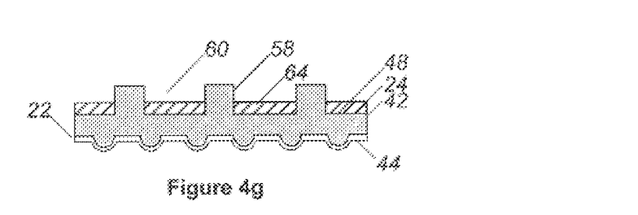
FIG. 4g is a side view illustration of the substrate wafer, following exposure and development, where the layer of photoresist material remains only in the trough areas surrounding the lens arms in accordance with the present invention.

As shown in FIG. 4g, the layer of photoresist material 64 is developed for approximately 90 seconds, after which, the photoresist layer 64 remains only in the trough areas 60 where the photoresist layer 64 was too thick to be exposed. The remaining photoresist layer 64 later provides protection to the surface 48 of the substrate wafer 24 during metallization of the lens arms 58.

Figure 4H:
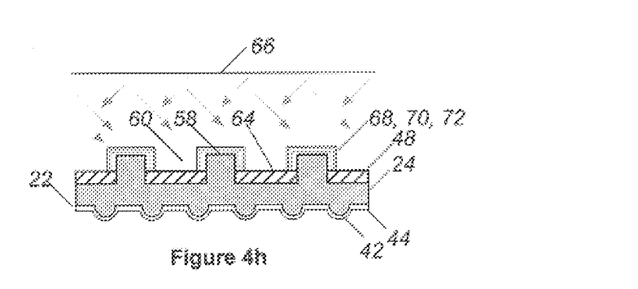
FIG. 4h is a side view illustration of the metallization of the array of lens arms in accordance with the present invention.

As illustrated in FIG. 4h, the lens arms 58 are metallized by metallizing the entire surface 48 of the substrate wafer 24. The surface 48 of the substrate wafer 24 is metallized by first evaporating 66 a layer 68 of titanium (Ti) over the surface 48, evaporating 66 a layer of platnium (Pt) 70 over the layer 68 of titanium, evaporating 66 a layer 72 of gold (Au) over the layer 70 of platnium, and finally applying a standard alloy treatment to the metal layers to bond the layers for better adhesion. Alternatively, the titanium and gold layers can be replaced with gold germanium (AuGe) alloy, nickel, or other equivalent metals.

Figure 4I:
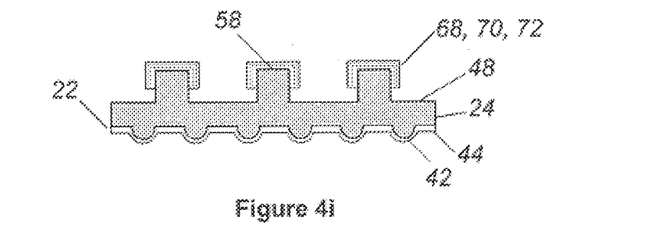
FIG. 4i is a side view illustration of the substrate wafer, following the metallization of the lens arms and the removal of remaining photoresist layer in accordance with the present invention.
Figure 4J:
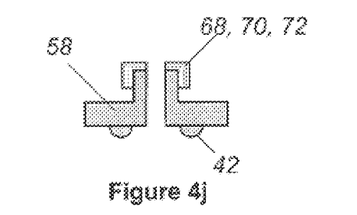
FIG. 4j is a side view illustration of a pair of micro-optical lenses with metallized lens arms which have been cleaved from the substrate wafer in accordance with the present invention.
Figure 4K:
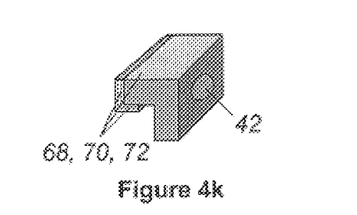
FIG. 4k is an illustration of a micro-optical lens with metallized lens arm in accordance with the present invention.

As illustrated in FIG. 4i, the photoresist layer 64 is removed by a metal liftoff process. Next, the lens 42 and lens arm 58 are cleaved from the substrate wafer 24 by saw cutting a lens 42 and lens arm 58 from the substrate wafer 24 for direct mounting to a micro-optical device, as shown in FIGS. 4j and 4k.

Figure 5:
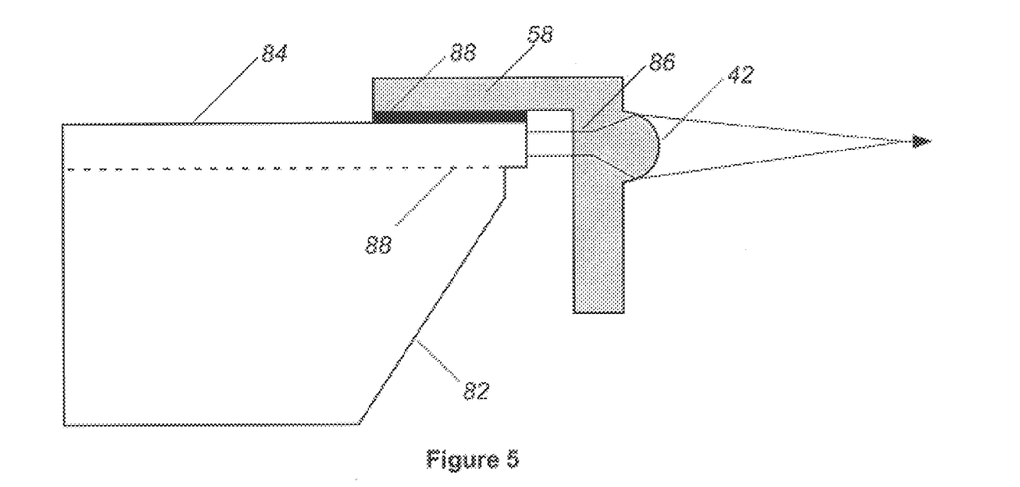
FIG. 5 is sideview illustration of a micro-optical lens direct mounted to a micro-optical device in accordance with the present invention.

Finally, as illustrated in FIG. 5, the micro-optical lens 42 and lens arm 58 are mounted to a micro-optical device 82 by soldering a metallized surface 88 to a surface 84 of the micro-optical device 82. FIG. 5 illustrates the micro-optical device 82 where a laser light 86 is passed through a waveguide or laser fiber 88, and the laser light 86 becomes the focused output of the optical lens 42.

Obviously, many modifications and variations of the present invention are possible in light of the above teachings. Thus, it is to be understood that, within the scope of the appended claims, the invention may be practiced otherwise than as specifically described above.

We claim:

1. A method for producing a III–V semiconductor micro-optical lens for hybrid integration to a micro-optical device, said method comprising the steps of:

coating a layer of photoresist material over an entire surface of a side of a substrate wafer;

baking the substrate wafer;

providing a mask where a pattern of the mask determines the quantity and shape of a lens formed on the substrate wafer;

selectively aligning the mask to the substrate wafer on the side of the substrate wafer coated with the layer of photoresist material;

exposing the side of the substrate wafer coated with the layer of photoresist material to a light source to form a photoresist mask;

developing the side of the substrate wafer containing the photoresist mask;

selectively etching the side of the substrate wafer coated with the layer of photoresist material in the areas surrounding the photoresist mask;

removing the photoresist mask and cleaning the surface of the substrate wafer;

selectively etching the entire surface of the side of the substrate wafer to form the lens;

coating the entire surface of the side of the substrate wafer with an antireflectivity coating; and fabricating a lens arm from a surface of a side of the substrate wafer opposite the side of the substrate wafer where the lens has been formed.

2. The method as recited in claim 1, wherein the step of coating the layer of photoresist material over the entire surface of the side of the substrate wafer further comprises the step of providing the substrate wafer of a material selected from the group consisting of indium phosphide, gallium arsenide, indium arsenide, and gallium phosphide.

3. The method as recited in claim 1, wherein the step of coating the layer of photoresist material further comprises the step of providing the photoresist material from the group consisting of 2-ethoxyethylacetate+n-butyl acetate in xylen, 2-ethoxyethylacetate+n-butyl acetate in xylen and hexamethyldisilozane, 2-ethoxyethylacetate+n-butyl acetate in xylen and silicon dioxide (SiO$_2$), and 2-ethoxyethylacetate+n-butyl acetate in xylen and silicon nitride (Si$_3$N$_4$), silicon dioxide (SiO$_2$) and complex silicon nitride (Si$_x$N$_y$), or aluminum oxide (Al$_2$O$_3$).

4. The method as recited in claim 1, wherein the step of baking the substrate wafer further comprises the step of soft baking the substrate wafer at a temperature of approximately 100° C.

5. The method as recited in claim 1, wherein the step of baking the substrate wafer further comprises the step of soft baking the substrate wafer for a period of approximately 45 minutes.

6. The method as recited in claim 1, wherein the step of providing the mask to determine the quantity and shape of the lens formed on the substrate wafer farther comprises the step of providing the mask to form an array of lenses.

7. The method as recited in claim 1, wherein the step of providing the mask to determine the quantity and shape of the lens formed on the substrate wafer further comprises the step of providing the mask to render the lens shape spherical.

8. The method as recited in claim 1, wherein the step of providing the mask to determine the quantity and shape of the lens formed on the substrate wafer further comprises the step of providing the mask to render the lens shape semi-spherical.

9. The method as recited in claim 1, wherein the step of providing the mask to determine the quantity and shape of the lens formed on the substrate wafer further comprises the step of providing the mask to render the lens shape aspherical.

10. The method as recited in claim 1, wherein the step providing the mask to determine the quantity and shape of the lens formed on the substrate wafer further comprises the step of providing the mask to render the lens shape semi-cylindrical.

11. The method as recited in claim 1, wherein the step of providing the mask to determine the quantity and shape of the lens formed on the substrate wafer further comprises the step of providing the mask to render the lens shape gausian-cylindrical.

12. The method as recited in claim 1, wherein the step of selectively etching the side of the substrate wafer in the areas surrounding the photoresist mask further comprises the step of wet chemical etching.

13. The method as recited in claim 1, wherein the step of selectively etching the side of the substrate wafer in the areas surrounding the photoresist mask further comprises providing a wet-chemical etch solution selected from the group consisting of deionized water:potassium dichromate:acetic acid:hydrobromic acid ($H_2O:K_2Cr_2O_7:H_3CCOOH:HBr$), bromine:methanol ($Br_2:H_3COH$), bromine:isopropanol ($Br_2:H_5C_2OH$), deionized water:hydrobromic acid:acetic acid ($H_2O:HBr:H_3CCOOH$), deionized water:potassium dichromate:sulfuric acid:hydrochloric acid ($H_2O:K_2Cr_2O_7:H_2SO_4:HCl$), phosphoric acid:hydrochloric acid ($H_3PO_4:HCl$), phosphoric acid:hydrochloric acid: deionized water ($H_3PO_4:HCl:H_2O$), phosphoric acid:hydrochloric acid:hydrogen peroxide ($H_3PO_4:HCl:H_2O_2$), iron chloride:hydrochloric acid ($FeCl_3:HCl$) under illumination, potassium periodide:hydrochloric acid ($KIO_3:HCl$), hydrochloric acid:acetic acid:hydrogen peroxide ($HCl:acetic acid:H_2O_2$), hydrochloric acid:hydrogen peroxide:deionized water ($HCl:H_2O_2:H_2O$), sulfuric acid:hydrogen peroxide: deionized water ($H_2SO_4:H_2O_2:H_2O$), citric acid:hydrogen peroxide:deionized water (citric acid:$H_2O_2:H_2O$), bromine:methanol ($Br_2:CH_3OH$), nitric acid:hydrofloric acid: deionized water ($HNO_3:HF:H_2O$), and hydrogen peroxide:amonium hydroxide:deionized water ($H_2O_2:NH_4OH:H_2O$).

14. The method as recited in claim 1, wherein the step of selectively etching the side of the substrate wafer in the areas surrounding the photoresist mask further comprises the step of dry etching.

15. The method as recited in claim 1, wherein the step of selectively etching the side of the substrate wafer in the areas surrounding the photoresist mask further comprises providing a dry etch mixture selected from the group consisting of argon and hydrochloric acid (Ar/HCl), argon hydrogen and chlorine (Ar/$Cl_2$/$H_2$), argon and hydrobromic acid (Ar/Hbr), argon and bromine (Ar/$Br_2$), argon and chlorine (Ar/$Cl_2$), argon and methane and hydrogen (Ar/$CH_4$/$H_2$), methyl iodide ($H_3CI$), bromine iodide ($IBr_3$), methane and hydrogen and sulfur flouride ($CH_4$/$H_2$/$SF_6$), ethyl iodide ($C_2H_5I$), isoethyl iodide ($C_3H_7I$), hexaflouride carbon and hydrogen ($C_2F_6$/$H_2$), and dichloro-difluoro carbon and oxygen ($CCl_2F_2$/$O_2$).

16. The method as recited in claim 1, wherein the step of dry etching the side of the substrate wafer in the areas surrounding the photoresist mask further comprises the step of using electron cyclotron resonance (ECR) etching.

17. The method as recited in claim 1, wherein the step of dry etching the side of the substrate wafer in the areas surrounding the photoresist mask further comprises the step of using inductive couple plasma (ICP) etching.

18. The method as recited in claim 1, wherein the step of dry etching the side of the substrate wafer in the areas surrounding the photoresist mask further comprises the step of using reactive-ion (RIE) etching.

19. The method as recited in claim 1, wherein the step of selectively etching the side of the substrate wafer in the areas surrounding the photoresist mask further comprises the step of etching the surface of the side of the substrate wafer at a temperature of from 40° C. to 60° C.

20. The method as recited in claim 1, wherein the step of removing the photoresist mask and cleaning the surface of the substrate wafer comprises the steps of:
  removing the photoresist mask using a solution of acetone;
  removing the acetone from the surface of the substrate using isopropanol;
  removing the isopropanol from the surface of the substrate using deionized water;
  removing oxides from the surface of the substrate using potassium hydroxide (KOH); and
  removing etching solution from the surface of the substrate using a solution of sulfuric acid:hydrogen peroxide:deionized water ($H_2SO_4:H_2O_2:H_2O$).

21. The method as recited in claim 1, wherein the step of selectively etching the entire surface of the side of the substrate wafer to form the lens further comprises providing a wet-chemical etch solution selected from the group consisting of deionized water:potassium dichromate:acetic acid:hydrobromic acid ($H_2O:K_2Cr_2O_7:H_3CCOOH:HBr$), bromine:methanol ($Br_2:H_3COH$), bromine:isopropanol ($Br_2:H_5C_2OH$), deionized water:hydrobromic acid:acetic acid ($H_2O:HBr:H_3CCOOH$), deionized water:potassium dichromate:sulfuric acid:hydrochloric acid ($H_2O:K_2Cr_2O_7:H_2SO_4:HCl$), phosphoric acid:hydrochloric acid ($H_3PO_4:HCl$), phosphoric acid:hydrochloric acid: deionized water ($H_3PO_4:HCl:H_2O$), phosphoric acid:hydrochloric acid:hydrogen peroxide ($H_3PO_4:HCl:H_2O_2$), iron chloride:hydrochloric acid ($FeCl_3:HCl$) under illumination, potassium periodide:hydrochloric acid ($KIO_3:HCl$), hydrochloric acid:acetic acid:hydrogen peroxide ($HCl:acetic acid:H_2O_2$), hydrochloric acid:hydrogen peroxide:deionized water ($HCl:H_2O_2:H_2O$), sulfuric acid:hydrogen peroxide: deionized water ($H_2SO_4:H_2O_2:H_2O$), citric acid:hydrogen peroxide:deionized water (citric acid:$H_2O_2:H_2O$), bromine:methanol ($Br_2:CH_3OH$), nitric adic:hydrofloric acid::deionized water ($HNO_3:HF:H_2O$), and hydrogen peroxide:amonium hydroxide:deionized water ($H_2O_2:NH_4OH:H_2O$).

22. The method as recited in claim 1, wherein the step of selectively etching the entire surface of the side of the substrate wafer to form the lens further comprises the step of etching the surface of the side of the substrate wafer at a temperature of from 30° C. to 40° C.

23. The method as recited in claim 1, wherein the step of coating the entire surface of the substrate wafer with the antireflectivity coating further comprises using a coating process selected from the group consisting of e-beam evaporation, sputtering, and chemical vapor deposition.

24. The method as recited in claim 1, wherein the step of coating the entire surface of the substrate wafer with the antireflectivity coating further comprises the step of depositing at least one layer of antireflectivity coating containing magnesium flouride (MgF), aluminum oxide ($Al_2O_3$), hafnium flouride (HfF), silicon dioxide ($SiO_2$), and silicon nitride ($Si_3N_4$).

25. A method for producing a III–V semiconductor micro-optical lens for hybrid integration to a micro-optical device, said method comprising the steps of:
  selectively boring a surface of a side of a substrate wafer to form a lens;
  cleaning the surface of the side of the substrate wafer;
  selectively etching the entire surface of the side of the substrate wafer where the lens is formed to polish the lens;
  coating the entire surface of the side of the substrate wafer with an antireflectivity coating; and
  fabricating a lens arm from a surface of a side of the substrate wafer opposite the side of the substrate wafer where the lens has been formed.

26. The method as recited in claim 25, wherein the step of cleaning the surface of the substrate wafer comprises the steps of:
  removing oxides from the surface of the substrate using potassium hydroxide (KOH); and
  removing etch residue from the surface of the substrate using a solution of sulfuric acid:hydrogen peroxide:deionized water ($H_2SO_4:H_2O_2:H_2O$).

27. The method as recited in claim 25, wherein the step of selectively etching the surface of the side of the substrate wafer to polish the lens further comprises providing a wet-chemical etch solution selected from the group consisting of deionized water:potassium dichromate:acetic acid:hydrobromic acid ($H_2O:K_2Cr_2O_7:H_3CCOOH:HBr$), bromine:methanol ($Br_2:H_3COH$), bromine:isopropanol ($Br_2:H_5C_2OH$), deionized water:hydrobromic acid:acetic acid ($H_2O:HBr:H_3CCOOH$), deionized water:potassium dichromate:sulfuric acid:hydrochloric acid ($H_2O:K_2Cr_2O_7:H_2SO_4:HCl$), phosphoric acid:hydrochloric acid ($H_3PO_4:HCl$), phosphoric acid:hydrochloric acid:deionized water ($H_3PO_4:HCl:H_2O$), phosphoric acid:hydrochloric acid:hydrogen peroxide ($H_3PO_4:HCl:H_2O_2$), iron chloride:hydrochloric acid ($FeCl_3:HCl$) under illumination, potassium periodide:hydrochloric acid ($KIO_3:HCl$), hydrochloric acid:acetic acid:hydrogen peroxide ($HCl$:acetic acid:$H_2O_2$), hydrochloric acid:hydrogen peroxide:deionized water ($HCl:H_2O_2:H_2O$), sulfuric acid:hydrogen peroxide:deionized water ($H_2SO_4:H_2O_2:H_2O$), citric acid:hydrogen peroxide:deionized water (citric acid:$H_2O_2:H_2O$), bromine:methanol ($Br_2:CH_3OH$), nitric acid:hydrofloric acid:deionized water ($HNO_3:HF:H_2O$), and hydrogen peroxide:amonium hydroxide:deionized water ($H_2O_2:NH_4OH:H_2O$).

28. The method as recited in claim 25, wherein the step of selectively etching the entire surface of the side of the substrate wafer to polish the lens further comprises the step of etching the surface of the side of the substrate wafer at a temperature of from 30° C. to 40° C.

29. The method as recited in claim 25, wherein the step of coating the entire surface of the substrate wafer with the antireflectivity coating further comprises using a coating process selected from the group consisting of e-beam evaporation, sputtering, and chemical vapor deposition.

30. The method as recited in claim 25, wherein the step of coating the entire surface of the substrate wafer with the antireflectivity coating further comprises the step of depositing at least one layer of antireflectivity coating containing magnesium flouride (MgF), aluminum oxide ($Al_2O_3$), hafnium flouride (HfF), silicon dioxide ($SiO_2$), and silicon nitride ($Si_3N_4$).

31. A method for producing a III–V semiconductor micro-optical lens arm for hybrid integration to a micro-optical device, said method comprising the steps of:
coating a layer of photoresist material over an entire surface of a side of a substrate wafer opposite a side of the substrate wafer where a lens has been formed;
baking the substrate wafer to prepare the photoresist material;
providing a mask where a pattern of the mask determines the quantity and size of a lens arm formed on the substrate wafer;
selectively aligning the mask to the substrate wafer on the side of the substrate wafer coated with the layer of photoresist material;
exposing the side of the substrate wafer coated with the layer of photoresist material to a light source to form a photoresist mask;
developing the side of the substrate wafer coated with the photoresist material;
etching the side of the substrate wafer coated with the layer of photoresist material in the areas surrounding the photoresist mask to form a lens arm and a trough area surrounding the lens arm;
removing the photoresist mask and cleaning the surface of the substrate wafer;
metallizing the lens arm;
cleaving the lens arm and lens to remove the lens arm and lens from the substrate wafer; and
mounting the lens to the micro-optical device.

32. The method as recited in claim 31, wherein the step of coating the layer of photoresist material over the entire surface of the side of the substrate wafer further comprises the step of providing the substrate wafer of a material selected from the group consisting of indium phosphide, gallium arsenide, indium arsenide, and gallium phosphide.

33. The method as recited in claim 31, wherein the step of coating the layer of photoresist material over the entire surface of the side of the substrate wafer further comprises the step of providing the photoresist material of 2-ethoxyethylacetate+n-butyl acetate in xylen and hexamethyldisilozane.

34. The method as recited in claim 31, wherein the step of baking the substrate wafer further comprises the step of soft baking the substrate wafer at temperature of approximately 100° C.

35. The method as recited in claim 31, wherein the step of baking the substrate wafer further comprises the step of soft baking the substrate wafer for a period of approximately 45 minutes.

36. The method as recited in claim 31, wherein the step of providing the mask to determine the quantity and shape of the lens arm formed on the substrate wafer further comprises the step of providing the mask to form an array of lens arms.

37. The method as recited in claim 31, wherein the step of selectively aligning the mask to the substrate wafer further comprises the step of performing the alignment with an infra-red camera to align the lens arm mask with the lens formed on the side of the substrate wafer opposite the side containing the lens arm.

38. The method as recited in claim 31, wherein the step of etching the side of the substrate wafer in the areas surrounding the photoresist mask further comprises providing a dry etch mixture selected from the group consisting of argon and hydrochloric acid (Ar/HCl), argon and chlorine ($Ar/Cl_2H_2$), argon and hydrobromic acid (Ar/Hbr), argon and bromine ($Ar/Br_2$), argon and chlorine ($Ar/Cl_2$), argon and methane and hydrogen ($Ar/CH_4/H_2$), methyl iodide ($H_3CI$), bromine iodide ($IBr_3$), methane and hydrogen and sulfur flouride ($CH_4/H_2/SF_6$), ethyl iodide ($C_2H_5I$), isoethyl iodide ($C_3H_7I$), hexaflouride carbon and hydrogen($C_2F_6/H_2$), and dichloro-difluoro carbon and oxygen ($CCl_2F_2/O_2$).

39. The method as recited in claim 31, wherein the step of etching the side of the substrate wafer in the areas surrounding the photoresist mask further comprises the step of dry etching using electron cyclotron resonance (ECR) etching.

40. The method as recited in claim 31, wherein the step of etching the side of the substrate wafer in the areas surrounding the photoresist mask further comprises the step of dry etching using inductive couple plasma (ICP) etching.

41. The method as recited in claim 31, wherein the step of etching the side of the substrate wafer in the areas surrounding the photoresist mask further comprises the step of dry etching using reactive-ion (RIE) etching.

42. The method as recited in claim 31, wherein the step of etching the side of the substrate wafer in the areas surrounding the photoresist mask further comprises the step of dry etching using an ion milling etching.

43. The method as recited in claim 31, wherein the step of removing the photoresist mask and cleaning the surface of the substrate wafer comprises the steps of:
removing the photoresist mask using acetone;
removing the acetone from the surface of the substrate using isopropanol;

removing the isopropanol from the surface of the substrate using deionized water;

removing oxides from the surface of the substrate using potassium hydroxide (KOH); and removing etching solution from the surface of the substrate using a solution of sulfuric acid:hydrogen peroxide:deionized water ($H_2SO_4:H_2O_2:H_2O$).

44. The method as recited in claim 31, wherein the step of metallizing the lens arm comprises the steps of:

coating a layer of photoresist material over the entire surface of the side of the substrate wafer containing the lens arm;

baking the layer of photoresist material;

exposing the layer of photoresist material;

developing the side of the substrate containing the layer of photoresist material;

evaporating a combination of metal layers over the lens arm; and removing the photoresist mask from the surface of the substrate wafer by a metal liftoff process.

45. The method as recited in claim 44, wherein the step of coating the layer of photoresist material over the entire surface of the side of the substrate further comprises the step of providing the photoresist material of 2-ethoxyethylacetate+n-butyl acetate in xylen.

46. The method as recited in claim 44, wherein the step of coating the layer of photoresist material over the entire surface of the side of the substrate further comprises the step of coating the photoresist material to a thickness sufficient to coat the trough area surrounding the lens arm to render only approximately one-half of the photoresist material coating in the trough area prone to exposure.

47. The method as recited in claim 44, wherein the step of coating the layer of photoresist material over the entire surface of the side of the substrate wafer further comprises the step of coating the layer of photoresist material at a spin speed of approximately 2000 rpm.

48. The method as recited in claim 44, wherein the step of baking the substrate wafer further comprises the step of soft baking the substrate wafer at temperature of approximately 80° C. to 135° C.

49. The method as recited in claim 44, wherein the step of baking the substrate wafer further comprises the step of soft baking the substrate wafer for a period of approximately 45 minutes.

50. The method as recited in claim 44, wherein the step of exposing the layer of photoresist material further comprises the step of float exposing the layer of photoresist material.

51. The method as recited in claim 44, wherein the step of exposing the layer of photoresist material further comprises the step of exposing the layer of photoresist material to an ultraviolet light source.

52. The method as recited in claim 44, wherein the step of evaporating a combination of metal layers over the lens arm comprises the steps of:

evaporating a layer of titanium (Ti) over an exposed surface of the lens arm;

evaporating a layer of platinum (Pt) over the layer of titanium;

evaporating a layer of gold (Au) over the layer of platinum; and applying an alloy treatment to the metal layers to adhere the titanium to the surface of the lens arm, the layer of platinum to the layer of titanium, and the layer of gold to the layer of platinum.

53. The method as recited in claim 31, wherein the step of mounting the lens to the micro-optical device further comprises the step of soldering the lens to a surface of the micro-optical device.

* * * * *